United States Patent
Kobayashi et al.

(10) Patent No.: US 6,933,736 B2
(45) Date of Patent: Aug. 23, 2005

(54) PROBER

(75) Inventors: Masahito Kobayashi, Nirasaki (JP); Haruhiko Yoshioka, Nirasaki (JP); Takafumi Fujita, 6-7-4, Ikuta, Tama-Ku, Kawasaki-Shi, Kanagawa-Ken (JP)

(73) Assignees: Tokyo Electron Limited, Tokyo-To (JP); Takafumi Fujita, Kanagawa-Ken (JP)

( * ) Notice: Subject to any disclaimer, the term of this patent is extended or adjusted under 35 U.S.C. 154(b) by 0 days.

(21) Appl. No.: 10/484,779

(22) PCT Filed: Jan. 8, 2003

(86) PCT No.: PCT/JP03/00084
§ 371 (c)(1),
(2), (4) Date: Jan. 23, 2004

(87) PCT Pub. No.: WO03/065441
PCT Pub. Date: Aug. 7, 2003

(65) Prior Publication Data
US 2004/0164759 A1 Aug. 26, 2004

(30) Foreign Application Priority Data
Jan. 30, 2002 (JP) ...................................... 2002-021048

(51) Int. Cl.[7] .............................................. G01R 31/02
(52) U.S. Cl. ...................... 324/754; 324/758; 324/765
(58) Field of Search .................................. 324/754–765

(56) References Cited

U.S. PATENT DOCUMENTS

| | | | | |
|---|---|---|---|---|
| 5,436,571 A | * | 7/1995 | Karasawa .................... | 324/765 |
| 5,642,056 A | * | 6/1997 | Nakajima et al. ........... | 324/758 |
| 5,814,733 A | * | 9/1998 | Khoury et al. ............... | 73/658 |

FOREIGN PATENT DOCUMENTS

| | | |
|---|---|---|
| JP | 05-149379 | 6/1993 |
| JP | 06-069321 | 3/1994 |
| JP | 10-082204 | 3/1998 |
| JP | 11-304837 | 11/1999 |
| JP | 2000-357824 | 12/2000 |
| JP | 2001-189354 | 7/2001 |

OTHER PUBLICATIONS

Modern Dictionary of Electronics Sixth Edition Rudolf F. graf.*
Communication In Cases For Which No Other Form is Applicable (Form PCT/IB/345) issued for PCT/JP2003/000084 (Jul. 1992).
New Corrected Form PCT/IB/308 issued for PCT/JP2003/000084 (Apr. 2002).

* cited by examiner

*Primary Examiner*—Vinh Nguyen
*Assistant Examiner*—Emily Y Chan
(74) *Attorney, Agent, or Firm*—Smith, Gambrell & Russell, LLP

(57) ABSTRACT

This invention is a probe apparatus including: a stage onto which a substrate to be processed is placed, a semiconductor device having a plurality of groups of electrode pads being formed on the substrate to be processed; a probe-card holding mechanism that holds a probe card provided with a group of probe needles corresponding to each group of electrode pads; and a driving mechanism that moves the stage and causes the group of probe needles to successively come in contact with the respective groups of electrode pads. A converting device that converts mechanical vibration energy generated in components of the probe apparatus into electrical energy, and an electrical circuit that discreates an electrical current based on the electric energy converted by the converting device are further provided.

7 Claims, 6 Drawing Sheets

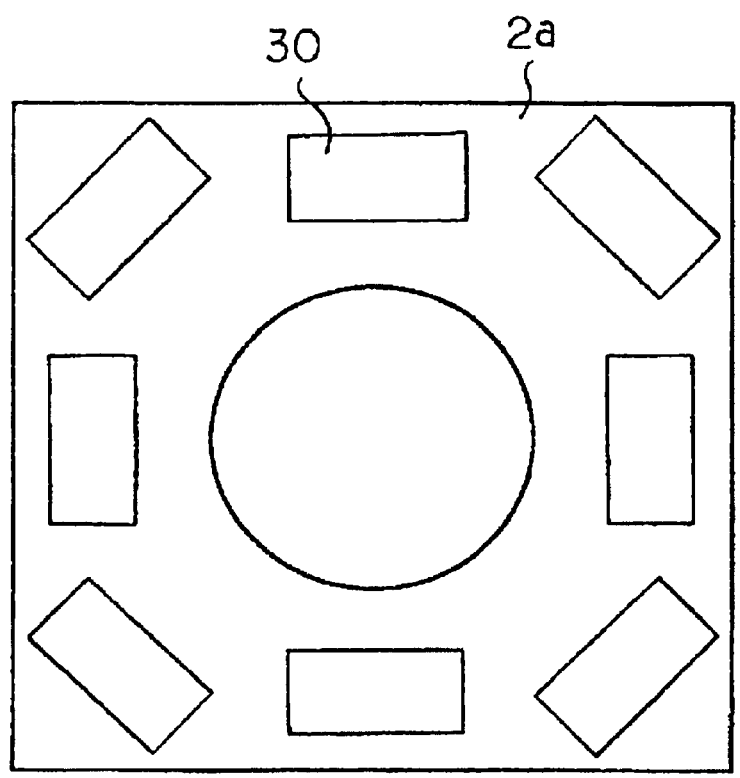
F I G. 5

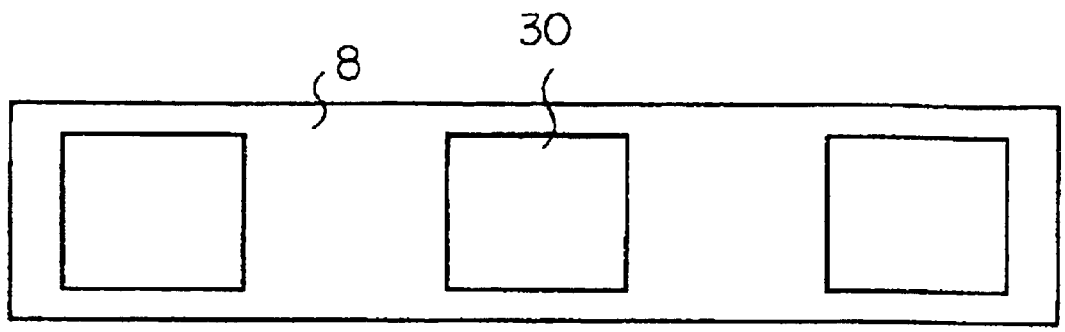
F I G. 7
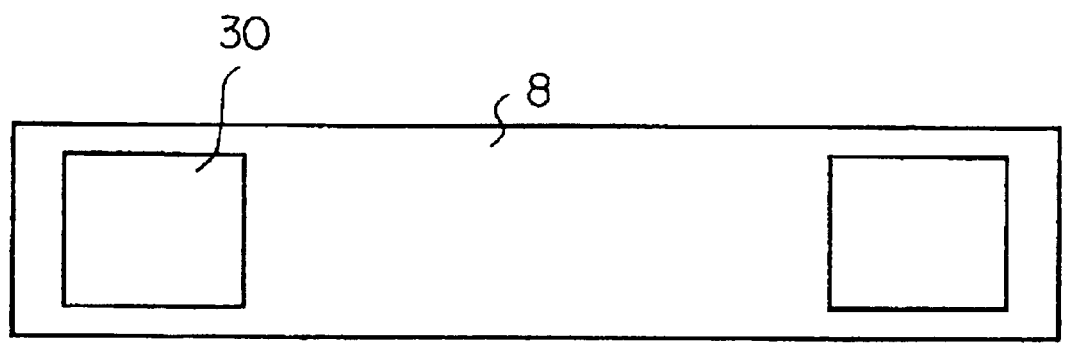
F I G. 8
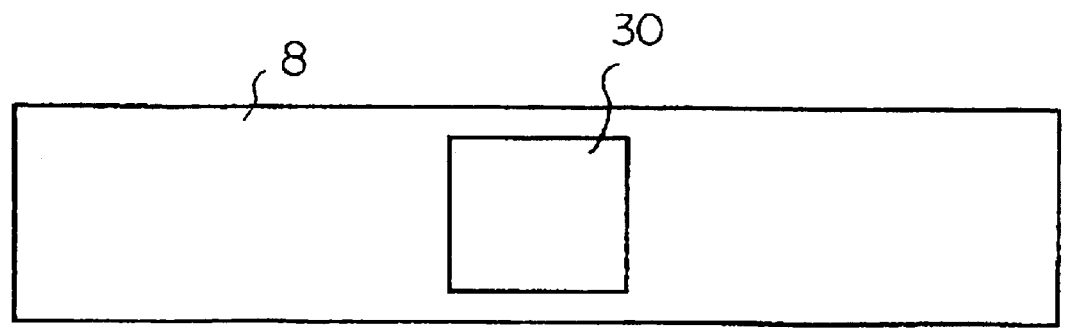
F I G. 9

PROBER

FIELD OF THE INVENTION

This invention relates to a probe apparatus that carries out an electric inspection to a semiconductor device formed on a substrate to be measured such as a semiconductor wafer, by causing a probe stylus of a probe card to come in contact with the semiconductor device.

BACKGROUND ART

Conventionally, for example in a field of manufacturing semiconductor units, with respect to many semiconductor devices formed on a semiconductor wafer, before the semiconductor wafer is cut and divided, an electric characteristic of each of the many semiconductor devices is measured to examine whether it is defective or not. A probe apparatus is used for the examination.

A wafer-stage that can hold a semiconductor wafer is provided in the probe apparatus. The wafer-stage is provided with a driving mechanism, which includes an X-Y drive mechanism such as an X-Y table and a Z-axis drive mechanism or the like. By means of the driving mechanism, a semiconductor wafer held on the wafer-stage can be moved in X-Y-Z directions.

A probe-card holding mechanism is provided above the wafer-stage for holding a probe card provided with many probe needles correspondingly to electrode pads of semiconductor devices.

Then, a predetermined probe card is held by the above probe-card holding mechanism. A semiconductor wafer, whose electric characteristic is to be examined, is arranged on the wafer-stage. Then, by moving the wafer-stage in the X-Y-Z directions, the group of probe needles is moved at a predetermined movement pitch relatively to the plurality of groups of electrode pads, so that the former comes in contact with the latter successively. Thus, by means of testers electrically connected to the group of probe needles, it is examined whether an electric characteristic of each semiconductor device is good or not.

As described above, in the conventional probe apparatus, by the wafer-stage being moved, the group of probe needles comes in contact with the plurality of groups of electrode pads, successively. The movement of the wafer-stage is carried out step by step. That is, the movement and stop of the wafer-stage is repeated at the predetermined pitch. While the wafer-stage is stopped, an electric characteristic of each semiconductor device is examined.

However, when the wafer-stage is stopped after it is moved, mechanical vibrations caused by moving and stopping the wafer-stage may remain in respective components of the probe apparatus. Because of the mechanical vibrations, the contact state between a group of electrode pads and the group of probe needles may become unstable, which may make it impossible to favorably measure the electric characteristic.

In order to solve the above problems, the above measurement may be carried out after a predetermined delay time after the wafer-stage is stopped. However, if such a delay time becomes long, throughput may be lowered.

In addition, if a vibration is given to a group of electrode pads of semiconductor devices and the group of probe needles when they come in contact with each other, the surfaces of electrode pads may be scratched by the probe needles in an undesired manner so that the surfaces may be damaged.

Furthermore, if the above mechanical vibration is transmitted to a camera or the like used for a positioning operation, focusing thereof may not be achieved. Even if the focusing is achieved, the image of the camera may hobble and thus the positioning operation may not be achieved. Thus, anyway, the positioning operation has to be waited until the vibration is attenuated, which may badly affect the throughput.

Recently, semiconductor wafers have been enlarged to a 12-inch diameter size or the like. Thus, components of the wafer-stage, size of the head plate and so on have been enlarged, and weights thereof have been also increased. Therefore, the problems of the above mechanical vibration tend to be especially significant.

SUMMARY OF THE INVENTION

This invention is intended to solve the above problems. The object of this invention is to provide a probe apparatus wherein a mechanical vibration may be earlier reduced, good measurement may be conducted with high throughput, and generation of damage of an electrode pad by the vibration may be inhibited.

This invention is a probe apparatus comprising: a stage onto which a substrate to be processed is placed, a semiconductor device having a plurality of groups of electrode pads being formed on the substrate to be processed; a probe-card holding mechanism that holds a probe card provided with a group of probe needles corresponding to each group of electrode pads; and a driving mechanism that moves the stage and causes the group of probe needles to successively come in contact with the respective groups of electrode pads; the probe apparatus further comprising: a converting device that converts mechanical vibration energy generated in components of the probe apparatus into electrical energy; and an electrical circuit that discreates an electrical current based on the electric energy converted by the converting device.

According to the present invention, the object of the invention may be achieved. That is, the mechanical vibration may be earlier reduced, good measurement may be conducted with high throughput, and generation of damage of the electrode pads by the vibration may be inhibited.

It is preferable that a plurality of the converting devices is provided. In addition, for example, the converting device is a piezoelectric device.

In addition, for example, the probe-card holding mechanism may be fixed to a plate member, and the converting device may be provided on the plate member.

In addition, preferably, a positioning camera for taking an image of the substrate to be processed and conducting a positioning operation threreof is further provided. In the case, for example, the converting device may be provided on a supporting member that supports the positioning camera.

In addition, preferably, the electrical circuit consists of an LR series circuit.

BRIEF DESCRIPTION OF THE DRAWINGS

FIG. 5 is a view showing a structure of main parts of the probe apparatus of FIG. 1;

FIG. 7 is a view showing an example wherein converting devices are arranged on a supporting member of a bridge camera;

FIG. 8 is a view showing another example wherein converting devices are arranged on a supporting member of a bridge camera; and FIG. 9 is a view showing another example wherein a converting device is arranged on a supporting member of a bridge camera.

DESCRIPTION OF THE PREFERRED EMBODIMENT

Hereinafter, embodiments of the present invention are explained with reference to attached drawings.

Figure 1:
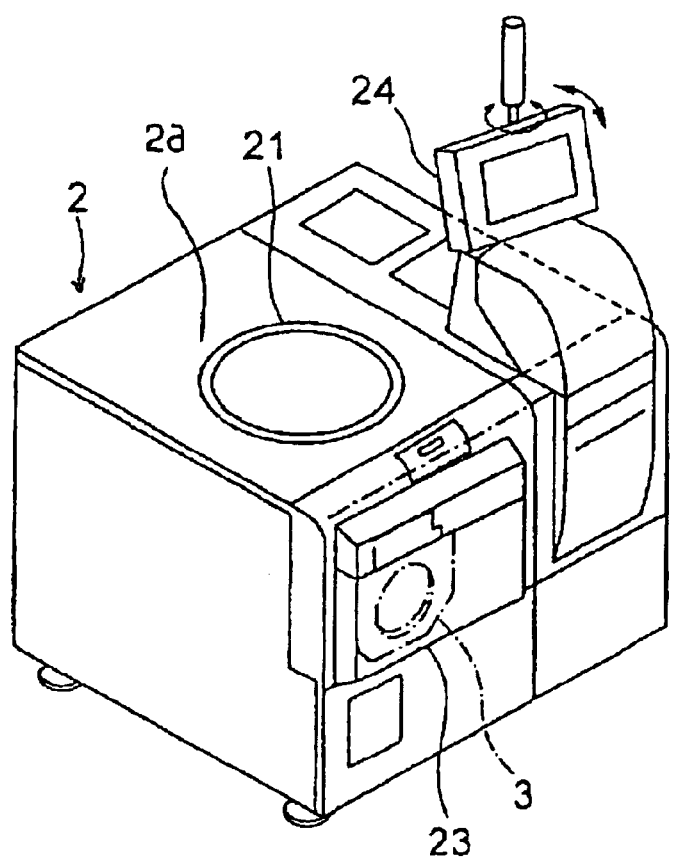
FIG. 1 is a view showing a total appearance of an embodiment of a probe apparatus according to the present invention.
Figure 2:
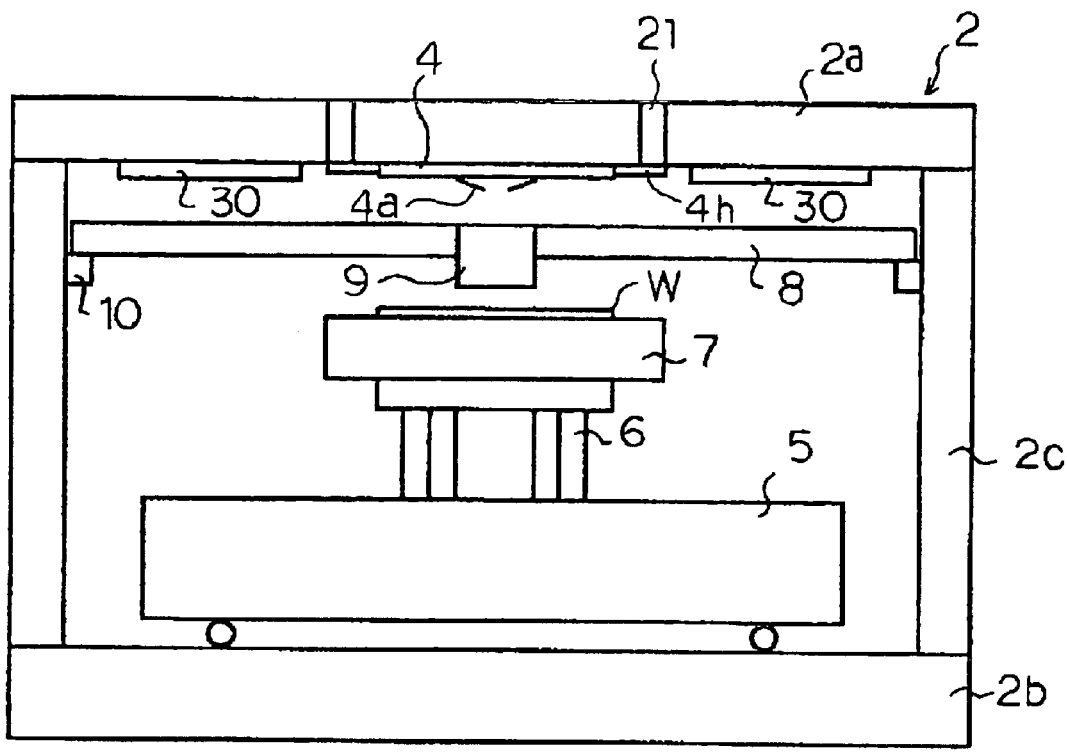
FIG. 2 is a schematic view showing a longitudinal sectional structure of the probe apparatus of FIG. 1.

FIGS. 1 and 2 show a structure of a probe apparatus according to an embodiment of the present invention. FIG. 1 is a perspective view of the total probe apparatus, and FIG. 2 is a sectional view of main parts of the probe apparatus.

As shown in FIGS. 1 and 2, the probe apparatus of the embodiment includes a housing 2 as an outer container. An upper surface of the housing 2 serves as a head plate 2a. The head plate 2a is provided with an insert ring 21. A probe-card holding mechanism 4h is provided at the insert ring 21. A probe card 4 is detachably held by means of the probe-card holding mechanism 4h.

In the housing 2, a wafer cassette (not shown) containing semiconductor wafers, a conveying mechanism for conveying the semiconductor wafers between a wafer-stage 7 and the wafer cassette, and so on are contained.

In addition, in FIG. 1, the reference number 3 indicates a tray for conveying the probe card 4 between the probe-card holding mechanism 4h provided at the insert ring 21 and an outside part of the housing 2. The reference number 23 indicates a cover member that covers the tray 3 when the tray 3 is not used. The reference number 24 is a display unit that displays a picture for operating the probe apparatus.

The tray 3 is constructed to be horizontal when the tray 3 is used, and to be turned in a horizontal plane and vertically moved between an inside part and an outside part of the housing 2. When the tray 3 is not used, the tray 3 is in a longitudinal position as shown in FIG. 1, to be parallel with a front surface of the housing 2.

In addition, as shown in FIG. 2, a probe base 2b is provided at a bottom portion of the housing 2. A lateral-wall forming member 2c that forms a lateral wall of the housing 2 is provided between the probe base 2 and the head plate 2a.

In the housing 2, an X-Y stage 5 is provided as a drive mechanism in X-Y directions. The wafer stage 7 (chuck top) is arranged above the X-Y stage 5 via a Z-axis drive mechanism 6. A semiconductor wafer W may be placed onto the wafer-stage 7. The semiconductor wafer W may be absorbed and fixed to the wafer-stage 7 by means of a vacuum chuck not shown.

A supporting member 8 is arranged above the wafer-stage 7 to traverse between opposed lateral-wall portions of the housing 2. A bridge camera 9 for taking an image of the semiconductor wafer W to position the same is arranged on the supporting member 8. Both end portions of the supporting member 8 have rails 10. Thus, the supporting member 8 can be moved along the rails 10 in a direction perpendicular to the paper of FIG. 2. Thus, the bridge camera 9 can be moved between an image-taking position above the wafer-stage 7 and a suitable evacuating position away from a space above the wafer-stage 7.

Figure 3:
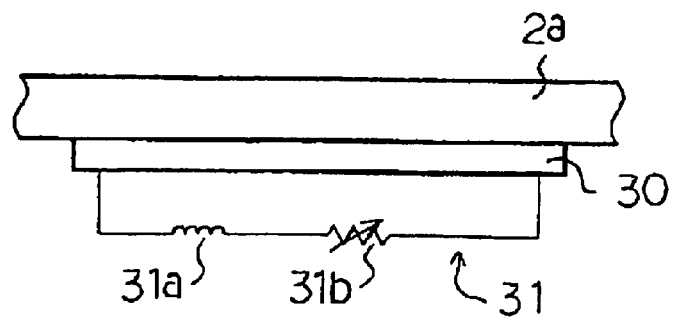
FIG. 3 is a view showing a structure of main parts of the probe apparatus of FIG. 1.

In addition, in the embodiment, a plurality of plate-like converting devices 30, each of which converts mechanical vibration energy into electrical energy, are provided on a reverse surface of the head plate 2a. Each converting device 30 consists of a piezoelectric device, for example. As shown in FIG. 3, each converting device 30 is connected to an electrical circuit 31 that discreates an electric current generated based on the electrical energy converted by each converting device 30.

The electrical circuit 31 is an LR series circuit consisting of: an inductance component 31a including a coil or the like, and a resistance component 31b including a variable resistance or the like. The circuit is adapted to attenuate electric current generated by the converting device 30 within a short time, to discreate the electric current within a short time. The respective values of the inductance component 31a and the resistance component 31b have to be suitably selected in accordance with frequency or the like of the electric current generated based on the electrical energy converted by the converting device 30.

As described above, in the embodiment, the converting devices 30 and the electrical circuits 31 form a vibration attenuating mechanism that can convert the mechanical vibration energy into the electrical energy, attenuate it within a short time and finally discreate it.

The converting device 30 has directional property. Thus, in order to efficiently attenuate the mechanical vibration generated at the head plate 2a, it is preferable that an arrangement position and an arrangement direction of each converting device 30 at the head plate 2a are suitably set in accordance with a direction of the mechanical vibration generated at the head plate 2a.

Herein, it is often that four corners of the head plate 2a are supported by column-like members not shown. In such a case, it is often that the head plate 2a vibrates in such a manner that a center portion of the head plate 2a bends while the head plate 2a is supported on the four corners as fulcrums.

Figure 4:
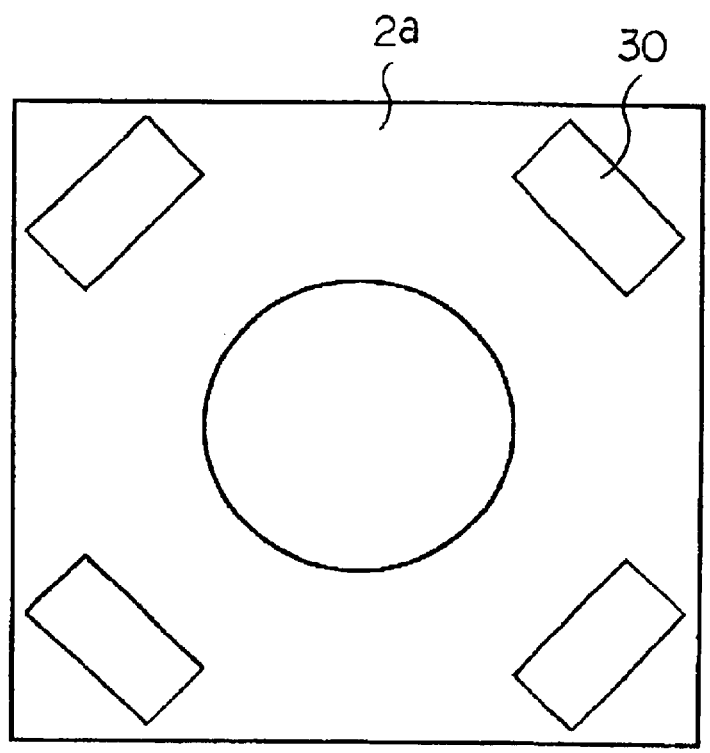
FIG. 4 is a view showing a structure of main parts of the probe apparatus of FIG. 1.

In the case, for example as shown in FIG. 4, it is preferable that the (four) converting devices 30 are respectively arranged at the four corners of the head plate 2a. Alternatively, as shown in FIG. 5, it is preferable to arrange eight converting devices 30 respectively at the four corners of the head plate 2a and at positions between them. As a method of fixing the converting devices 30 on the head plate 2a, a method of fixing both end portions of each converting device 30 by means of screws or the like, or a method of attaching the converting devices 30 by means of adhesive or the like, may be used.

Of course, the positions (arrangement) and the numbers of the converting devices 30 may be any other than the above case. The arrangement positions and the arrangement numbers of the converting devices 30 are not limited but free if the mechanical vibration generated at the head plate 2a is efficiently transmitted to the converting devices 30 and the mechanical vibration energy is efficiently converted into the electrical energy.

Figure 6:
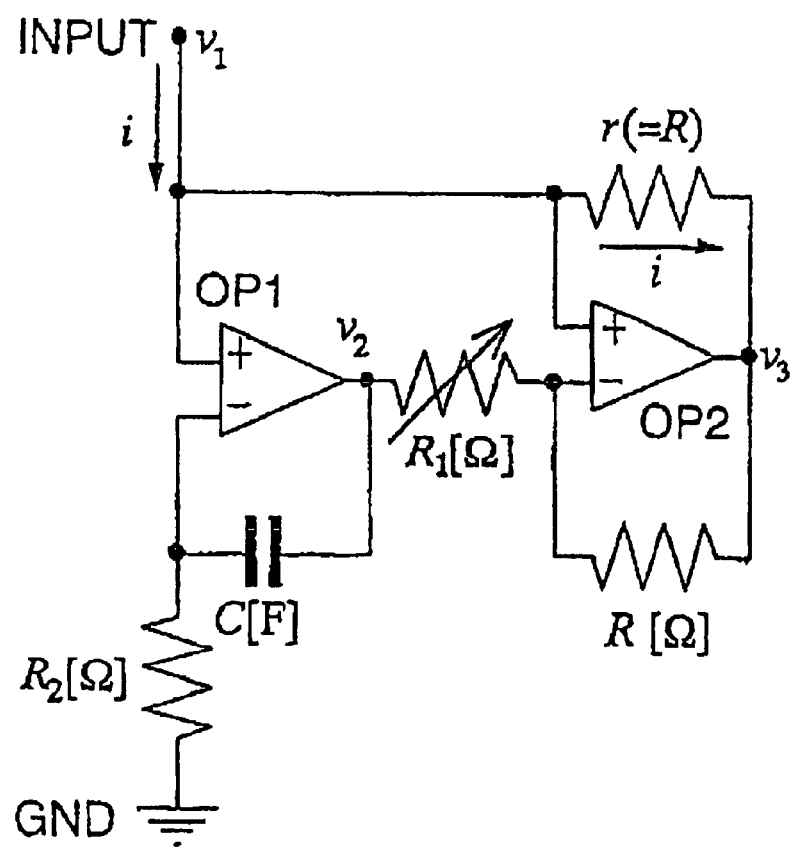
FIG. 6 is a chart showing another example of the electrical circuit shown in FIG. 3.

In addition, for example as shown in FIG. 6, the electrical circuit 31 may include two operational amplifiers as the inductance component 31a. In such a structure, greater inductance may be achieved by a relatively smaller circuit, and the value of the inductance may be variable.

Next, an operation of the probe apparatus of the embodiment is explained.

In the above probe apparatus, a semiconductor wafer W is conveyed by a conveying unit not shown, and placed onto the wafer-stage 7. The semiconductor wafer W is absorbed onto the wafer-stage 7 by means of the vacuum chuck.

After that, the wafer-stage 7 is moved in the X-Y-Z directions by means of the X-Y stage 5 and the Z-axis drive mechanism 6. Thus, the group of probe needles 4a provided in the probe card 4 successively comes in contact with the respective groups of electrode pads of the semiconductor devices formed on the semiconductor wafer placed on the wafer-stage 7. Thus, the testers electrically connected to the probe needles 4a and the semiconductor devices are electrically communicated with each other, so that one or more electric characteristics of the respective semiconductor devices are measured.

Herein, as the wafer-stage 7 is moved by the X-Y stage 5 and the Z-axis drive mechanism 6, the housing 2 or the like is mechanically vibrated. The head plate 2a supporting the probe card 4 is also mechanically vibrated.

However, the mechanical vibration energy is converted into the electrical energy by the above converting devices 30. The electric current based on the electrical energy is immediately attenuated by the electrical circuits 31, and then discreated thereby. Thus, the mechanical vibration energy of the head plate 2a is absorbed by the vibration attenuating mechanism formed by the converting devices 30 and the electrical circuits 31, and is immediately attenuated thereby.

Thus, after the wafer-stage 7 is moved by driving the X-Y stage 5 and the Z-axis drive mechanism 6 to cause the group of probe needles 4a to come in contact with a group of electrode pads of the semiconductor devices formed on the semiconductor wafer W, electric measurement can be started immediately, without any long delay time. That is, throughput may be improved.

In addition, since the mechanical vibration under the state wherein the probe needles 4a are in contact with the electrode pads may be inhibited, generation of damage of the electrode pads by the mechanical vibration may be inhibited.

In the above embodiment, the case wherein the converting devices 30 consisting of the piezoelectric devices are arranged on the head plate 2a is explained. However, the supporting member 8, whose both ends are supported by the housing 2 via the rails 10, has a structure easy to be vibrated mechanically, because the bridge camera 9, whose weight is great to some extent, is arranged thereon.

When the supporting member 8 is vibrated, the bridge camera 9 supported by the supporting member 8 is also vibrated. In the case, for example, when an image of the surface or the like of the semiconductor wafer W is taken by the bridge camera 9, focusing thereof may not be achieved because of problems about depth of field, or the image may hobble even if the focusing is achieved. In the case, until the vibration is calmed down, the positioning operation can not be started.

Thus, similarly to the head plate 2a, it is preferable to arrange a vibration attenuating mechanism consisting of a converting device 30 and an electrical circuit 31 onto the supporting member 8.

In the case, for example as shown in FIG. 7, three converting devices 30 are respectively provided in both end portions and a central portion of the supporting member 8. Alternatively, as shown in FIG. 8, two converting devices 30 are respectively provided in both end portions of the supporting member 8. Alternatively, as shown in FIG. 9, one converting device 30 is provided in a central portion of the supporting member 8.

Of course, the positions (arrangement) and the numbers of the converting devices 30 may be any other than the above case. The arrangement positions and the arrangement numbers of the converting devices 30 are not limited but free if the mechanical vibration generated at the supporting member 8 is efficiently transmitted to the converting devices 30 and the mechanical vibration energy is efficiently converted into the electrical energy.

As described above, since the vibration attenuating mechanism consisting of the converting device(s) 30 and the electrical circuit(s) 31 is provided on the supporting member 8 supporting the bridge camera 9, the vibration of the bridge camera 9 may be inhibited. Thus, generation of a situation difficult to conduct the positioning operation may be avoided, so that the positioning operation can be efficiently conducted within a short time.

As described above, the case wherein the vibration attenuating mechanism consisting of the converting devices 30 and the electrical circuits 31 is arranged on the head plate 2a and the case wherein the vibration attenuating mechanism is arranged on the supporting member 8 supporting the bridge camera are explained. However, this invention is not limited to the cases. Of course, the above vibration attenuating mechanism may be provided at any part other than the above members. Of course, the shape of the converting device 30, the structure of the electrical circuit 31, and so on can be suitably changed.

What is claimed is:

1. A probe apparatus for a substrate to be processed, the substrate having a semiconductor device with a plurality of groups of electrode pads thereon, the probe apparatus comprising:

a stage onto which the substrate to be processed is placed, a probe-card holding mechanism that holds a probe card provided with a group of probe needles corresponding to each group of electrode pads, a driving mechanism that moves the stage and causes the group of probe needles to successively come in contact with the respective groups of electrode pads, a converting device that converts mechanical vibration energy generated in components of the probe apparatus into electrical energy, and an electrical circuit that is in a closed circuit with the converting device and that attenuates the electric energy converted by the converting device.

2. A probe apparatus according to claim 1, wherein a plurality of the converting devices are provided.

3. A probe apparatus according to claim 1, wherein the converting device is a piezoelectric device.

4. A probe apparatus according to claim 1, wherein
   the probe-card holding mechanism is fixed to a plate member, and
   the converting device is provided on the plate member.

5. A probe apparatus according to claim 1, wherein a positioning camera for taking an image of the substrate to be processed and conducting a positioning operation thereof is further provided.

6. A probe apparatus according to claim 5, wherein the converting device is provided on a supporting member that supports the positioning camera.

7. A probe apparatus according to claim 1, wherein the electrical circuit consists of an LR series circuit.

* * * * *